(12) United States Patent  
Leal et al.

(10) Patent No.: US 8,970,026 B2  
(45) Date of Patent: Mar. 3, 2015

(54) METHODS AND STRUCTURES FOR REDUCING STRESS ON DIE ASSEMBLY

(71) Applicants: George R. Leal, Cedar Park, TX (US); Leo M. Higgins, III, Austin, TX (US); Tim V. Pham, Austin, TX (US)

(72) Inventors: George R. Leal, Cedar Park, TX (US); Leo M. Higgins, III, Austin, TX (US); Tim V. Pham, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 41 days.

(21) Appl. No.: 13/764,958

(22) Filed: Feb. 12, 2013

(65) Prior Publication Data

US 2014/0225268 A1    Aug. 14, 2014

(51) Int. Cl.
- *B23K 35/24* (2006.01)
- *H01L 23/498* (2006.01)
- *H01L 23/00* (2006.01)

(52) U.S. Cl.
CPC .......... *H01L 23/49866* (2013.01); *H01L 24/03* (2013.01)
USPC ........... 257/690; 257/772; 257/773; 257/779; 257/780; 228/178; 228/180.22; 228/56.3; 228/176

(58) Field of Classification Search
USPC .......... 257/690, 772, 773, 779, 780; 228/178, 228/180.22, 56.3, 176
See application file for complete search history.

(56) References Cited

U.S. PATENT DOCUMENTS

| | | |
|---|---|---|
| 7,611,041 B2 | 11/2009 | Tago et al. |
| 7,784,669 B2 | 8/2010 | Hougham et al. |
| 2008/0182124 A1 | 7/2008 | Gruber et al. |
| 2009/0197114 A1 | 8/2009 | Shih et al. |
| 2010/0203353 A1 | 8/2010 | Anderson et al. |
| 2014/0299986 A1* | 10/2014 | Sakurai et al. ................ 257/737 |

* cited by examiner

*Primary Examiner* — Michael Shingleton
(74) *Attorney, Agent, or Firm* — Mary Jo Bertani

(57) ABSTRACT

A first set of electrically conductive cladding is disposed on an inner section of one external side of a package substrate. The first set electrically conductive cladding is fabricated with a first solder compound. A second set of electrically conductive cladding is disposed on an outer section of the one external side of the substrate. The second set of electrically conductive cladding consists of a second solder compound. The outer section can be farther away from a center of the one external side of the substrate than the inner section. During a reflow process, the first and second solder compounds are configured to become completely molten when heated and the first solder compound solidifies at a higher temperature during cool down than the second solder compound.

20 Claims, 2 Drawing Sheets

METHODS AND STRUCTURES FOR REDUCING STRESS ON DIE ASSEMBLY

BACKGROUND

1. Field

This disclosure relates generally to semiconductor devices, and more specifically, to a method of forming a semiconductor package with flip chip interconnect and lead-free bumps.

2. Related Art

Recent packaging development work on semiconductor die with ultra-low K (ULK) dielectrics and lead-free bumps has shown a consistent issue with inter-layer dielectric delamination under the C4 flip-chip solder bump or interconnect. The C4 bumps are also referred to as electrical contacts. This delamination is known as white bumps or ghost bumps due to its appearance under acoustic microscopy analysis, and occurs more prevalently on large die/large packages. Mechanical modeling and recent experience has shown that the outer rows of bumps have the highest probability of experiencing delamination under the bump as these locations experience the highest stress during chip attach reflow cool down.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and semiconductor devices disclosed herein substantially reduce or even eliminate white bumps or interlayer dielectric (ILD) delamination in a semiconductor die in a flip chip package. The white bumps form generally at the outer edges of the semiconductor die and are caused by stress that occurs during cool down after a reflow process to attach a flip chip die to a package substrate. To eliminate the white bumps, electrically conductive die attach material referred to as solder cladding on package substrate with a relatively higher solidus temperature can be used for an inner section of the package substrate contacts compared to the solidus temperature of die attach material or cladding used for the contacts in the outer sections of the package substrate. As the assembled device cools down, the die attach material on the inner section solidifies before the die attach material on the outer sections of the die/package substrate, thus reducing the stress transferred to the die and specifically the ILD layers adjacent to the C4 bumps in the outer rows.

The term "solidus temperature" as used herein refers to the characteristic temperature at which a material such as a solder alloy solidifies. Solder materials commonly exhibit supercooling or under-cooling which is defined by the existence of a liquid phase in a solidifying material at a temperature below the theoretical solidus temperature. Consequently the cooling, or solidifying solder's effective solidus temperature may be lower than the theoretical solidus temperature.

Figure 1:
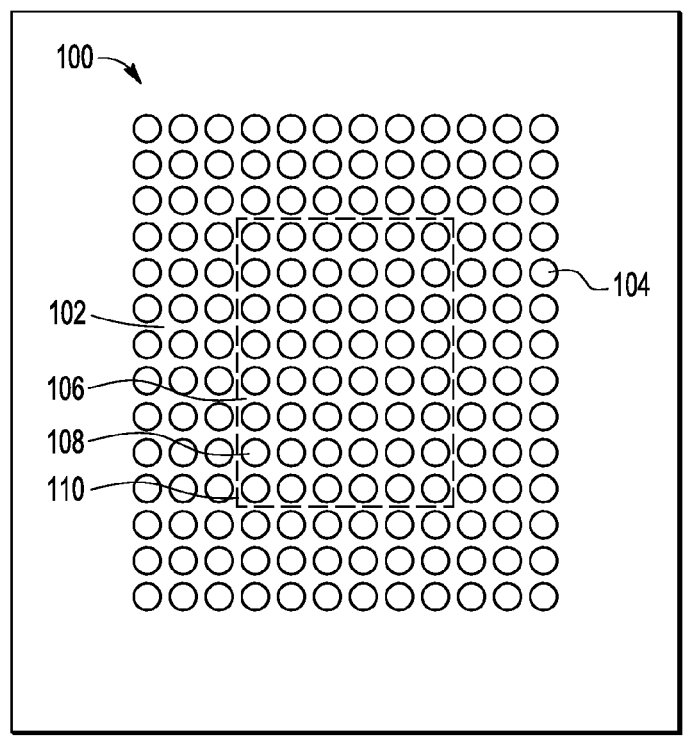
FIG. 1 shows a bottom view of an embodiment of a semiconductor substrate in accordance with the present invention.

FIG. 1 shows a top view of an embodiment of a package substrate 100 in accordance with the present invention. Package substrate 100 has an array of contacts pads matching contacts on a semiconductor die (not shown). First set of electrically conductive contacts 108 (also referred to as "cladding") is disposed on an inner section 106 shown by boundary 110 of an external side of package substrate 100. Second set of electrically conductive contacts 104 (also referred to as "cladding") is disposed on an outer section 102 around the periphery of inner section 106. The outer section 102 is farther away from the center of package substrate 100 than the inner section 106. Inner section 106 and outer section 102 are shown as rectangular areas, however, inner and outer sections 106, 102 and boundary 110 can have any suitable shapes. Outer section 102 may or may not be continuous and may or may not at least partially surround inner section 106. Additionally, more than two sets or groups of contacts with different effective solidus temperatures can be used to support higher granularity of staged melting/freezing points. Stress in connections to contacts 104, 108 is generally considered to increase as a function of distance from the center of the contact array, commonly referred to as the distance from the neutral point (DNP). It is known that the connections nearest to the corners of the contact array have the highest stress, while, in general, the connections in the outer region have higher stress than the stress on the connections in the central region. The solidification of connections in inner section 106 before solidification of connections in the outer section 102 effectively reduces the thermal expansion mismatch stress imposed on connections at the corner and outer section 102 because the DNP is effectively reduced to the distance from connections at the corner and outer section 102 to the closest connection in the previously solidified inner section 106.

Contacts 104, 108 can be formed using a two or more step application process during fabrication to apply two or more compatible electrically conductive alloys that have different effective solidus temperatures when combined with the solder bump on the chip. A first mask or stencil can be used to block off outer section 102 while contacts 108 are formed. A second mask or stencil can be used to block off and provide clearance for inner section 106 while contacts 104 are formed. Contacts 104, 108 can include a pad or pillar made of copper or other conductive material topped with a respective solder compound. Alternatively, contacts 104, 108 can have any other configuration suitable for conducting signals from an integrated circuit (IC) die to substrate 100. Substrate 100 can be an organic printed circuit board or other suitable chip carrier. A corresponding IC die may have a flip-chip bump, copper pillar, or other suitable configuration.

During a die attach reflow process, package substrate 100 is placed adjacent to and in contact with an IC die with flip chip bumps (not shown). Contacts 104, 108 are heated to a melting temperature and package substrate 100 becomes attached to the IC die as contacts 104, 108 and matching bumps on IC die cool down. First set of contacts 108 on the inner section 106 are configured to solidify at a higher temperature than second set of contacts 104 on outer section 102 during the reflow cooling process. Contacts 108 can be made of a first solder compound that has an effective solidus temperature that is higher when combined with the solder bump on the chip than the effective solidus temperature of a second solder compound that is used for contacts 104 to cause contacts 108 to solidify at a higher temperature than contacts 104 during cool down.

Figure 2:
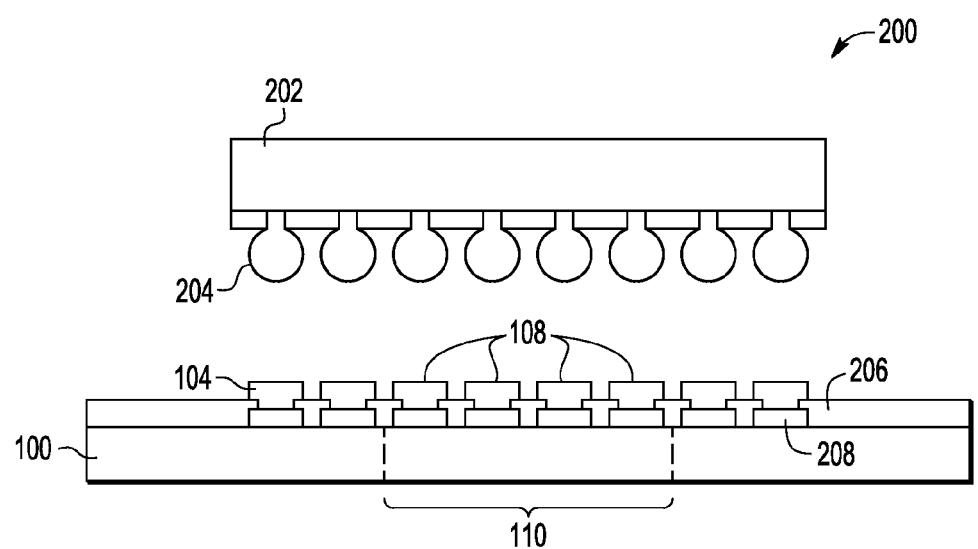
FIG. 2 shows a side view of a semiconductor device using the semiconductor substrate of FIG. 1 and a die which will be attached to the substrate.

Referring to FIG. 2, a side view of an embodiment of semiconductor device 200 is shown with package substrate 100 of FIG. 1 and IC die 202 with electrically conductive bumps 204 to which contacts or cladding 104, 108 of package substrate 100 will be attached. Solder mask 206 surrounds contacts 104 and individual contact pads 208 on substrate 100. Contacts 104 are in electrical contact with their respective adjacent pads 208. Conductive bumps 204 are generally made of a single solder compound or alloy and applied with electroplating, printing, or other method known in the art. Substrate 100 is typically a glass reinforced laminate core HDI structure but can be any substrate configuration known in the art such as BT laminate, coreless HDI, or HiCTE ceramic.

During the reflow process, contacts 104, 108 and bumps 204 are heated to a temperature required to melt contacts 108 and bumps 204, and contacts 104 and bumps 204 essentially homogeneously. Package substrate 100 and IC die 202 are positioned together with contacts 104, 108 touching bumps 204 so that contacts 104, 108 meld with bumps 204 while in the liquid (melted) essentially homogeneous state. During the cool-down phase of the reflow process, contacts 108 solidify and attach to bumps 204 at a higher temperature than contacts 104, and stresses that cause ILD delamination on the outer periphery of device 200 will be reduced and thus decrease or eliminate white bumps.

A first solder compound used for contacts 108 is configured to become completely molten when heated and to solidify at a higher temperature during cool down than a second solder compound used to make contacts 104. This solidifying temperature difference is maintained when combined with the solder of bumps 204. The first solder compound can consist of at least two substances and each substance in the first solder compound is greater than or equal to 0.5 percent weight and less than or equal to 99.5 percent weight of the first solder compound.

Since the resulting composition of the first solder compound with bumps 204 is different, in some cases substantially, than the composition of the second solder compound with bumps 204, no nucleating agents are used in any solder compositions. The first solder compound becomes solid at a temperature that is higher than the effective solidus temperature of the second solder compound due solely to the different compositions of solder compounds themselves.

In some embodiments, the first solder compound used for contacts 108 has an effective solidus temperature that is greater than or equal to 20° C. higher than an effective solidus temperature of a second solder compound used for contacts 104. Additionally, a solidus temperature of the second solder compound can be greater than or equal to 20° C. higher than a maximum junction temperature of the IC die due to possible electrical resistivity and electromigration concerns.

The solder compound on bumps 204 homogenizes with the solder compound on the substrate contacts 104, 108 to form an electrical connection. The term "connection" as used herein refers to the homogenized solder compound from both contacts 104, 108 on substrate 100 combined with the solder compound of contacts 204 on the IC die 202. The solder compound used for bumps 204 can be the same as or different from the solder compound used for contacts 104 or 108.

In some embodiments, a first solder compound used for contacts 108 and bumps 204 is an alloy of 95.3 to 97.3% by weight tin, 2.0 to 3.8% by weight silver, and 0.5 to 0.9% by weight copper with effective solidus temperature in the range of 200-227C.

In other embodiments, the first solder compound is an alloy of 98.5 to 99.5% by weight tin and 0.5 to 1.0% by weight copper, with effective solidus temperature in the range of 210-230C.

In still other embodiments, the first solder compound is an alloy of 94 to 99% by weight tin and 1.0 to 6.0% by weight antimony, with effective solidus temperature in the range of 212-232C.

In still other embodiments, the first solder compound is an alloy of 97 to 99.5% by weight tin and 0.5 to 3.0% by weight silver, with effective solidus temperature in the range of 215-230C.

In still further embodiments, the first solder compound is an alloy of 94.5 to 95.5% by weight tin, 2.5 to 4.5% by weight silver, and 0.5 to 1% by weight copper, with effective solidus temperature in the range of 202-237C.

The second solder compound used for contacts 104 on substrate 100 includes a substance that is at least 1 percent by weight that is not included in contacts 108 by more than an amount that would change the effective solidus temperature of contacts 108 by more than 15° C. Contacts 104 can be made of a second solder compound that comprises multiple substances. Each of the substances are greater than or equal to 1.0 percent by weight of the first solder compound. Contacts 108, on the other hand, consist of a second solder compound of one or more substances. At least one of the substances of the first solder compound is not included in the second solder compound to any appreciable extent. The term "appreciable" being that which would lower the solidus temperature of the second solder compound by more than 15° C. Additionally, the solder compound used for contacts 108 can become completely molten when heated during a reflow process, with no solid particles in the solder compound with the solder compound is at a highest melting temperature used during reflow process.

For example, in some embodiments, the second solder compound is an alloy of 40-45% by weight tin and 55 to 60% by weight bismuth, with effective solidus temperature in the range of 121-141C.

In other embodiments, the second solder compound is an alloy of 75 to 80% by weight tin and 20 to 25% by weight bismuth, with effective solidus temperature in the range of 120-145C.

In still other embodiments, the second solder compound is an alloy of 39.5 to 44% by weight tin, 0.5 to 1.5% by weight silver, and 55 to 60% by weight bismuth, with effective solidus temperature in the range of 115-135C.

In further embodiments, the second solder compound is an alloy of 90 to 93% by weight tin and 7 to 10% by weight zinc, with effective solidus temperature in the range of 179-199C.

In still further embodiments, the second solder compound is an alloy of 77 to 80% by weight tin, 5 to 7% by weight bismuth, and 15 to 17% by weight zinc, with effective solidus temperature in the range of 175-199C.

The effective solidus temperature for a solder compound consisting of tin with bismuth in the 21-58% by weight range will be approximately 140° C. The volume of liquid phase present for any composition with 21-58% by weight bismuth, at any temperature up to the liquidus temperature for the specific composition, will increase as the composition is increased in bismuth from 21% to 58%. For example, for tin with 57% by weight bismuth (Sn57Bi), 100 percent of the solder compound will exist as a liquid just 1° C. above the eutectic temperature (~140° C.), while for Sn-22Bi, only a very small percentage of the solder will be present as a liquid just 1° C. above the eutectic temperature. If the resulting solidus temperature is lower than desired, the solder compound can contain less bismuth since the solubility of bismuth in tin is approximately 5%. If the solder compound contains more than approximately 5% by weight bismuth, the liquid binary eutectic phase will form at approximately 140° C. upon reheating the solder compound.

If a solder connection solidus of 175° C. is desired, a Sn-22Bi cladding can be used. In combination with an equal volume of Sn-2Ag used for contacts 204, the resulting connection between bumps 204 and cladding/contacts 104 would have a composition of approximately 87.1% Sn-0.9Ag-13% Bi In a first example embodiment, a first solder compound of Sn-2Ag (melting point 221° C.) for bumps 204 and contacts 108, and a second solder compound of Sn-58Bi for contacts 104 is used. Assuming bumps 204 and contacts/cladding 104, 108 have same volume solder, Sn-2Ag has a density of 7.35 g/cc, Sn has a density of 7.31 g/cc, and Bi has a density of 9.78 g/cc. Sn-58Bi has a density of 8.57 g/cc. Note that a density estimate calculated using the weight percent of each element provides an estimate within 2% of the measured density. The density estimate is (0.42×7.31)+(0.58×9.78)=8.74 g/cc.

The composition of the homogenized solder connection will be 67.86Sn-0.92Ag-31.22Bi with a liquidus temperature of approximately 187° C. and a solidus temperature of approximately 135° C., significantly lower than contacts 104 and bumps 208 solidus of approximately 221° C.

In a second example embodiment, there is less bismuth in the Sn—Bi cladding 104 to achieve a solidus temperature of approximately 175° C. A first solder compound of Sn-2Ag for bumps 204 and contacts 108, and a second solder compound of Sn-24Bi for contacts 104 is used. Assuming bumps 204 and contacts/cladding 104, 108 have same volume solder, Sn-2Ag has a density of 7.35 g/cc, Sn has a density of 7.31 g/cc, and Bi has a density of 9.78 g/cc. Sn-24Bi has a density of 7.7827 g/cc. Note that a density estimate calculated using the weight percent of each element provides an estimate within 2% of the measured density. The composition of the homogenized solder connection will be 86.69Sn-0.97Ag-12.34Bi with a liquidus temperature of approximately 212° C. and a solidus temperature of approximately 175° C.

In a third example embodiment, cladding 104 with Sn—Bi—Zn has a solidus temperature of approximately 177° C. A first solder compound of Sn-2Ag for bumps 204 and contacts 108, and a second solder compound of Sn-16Zn-6Bi for contacts 104 is used. Assuming bumps 204 and contacts/cladding 104, 108 have same volume solder, Sn-2Ag has a density of 7.35 g/cc, Sn has a density of 7.31 g/cc, and Bi has a density of 9.78 g/cc. Sn-16Zn-6Bi has a density of 7.3946 g/cc. The composition of the homogenized solder connection will be 87.973Sn-0.997Ag-3.008Bi-8.022Zn with a liquidus temperature of approximately 215° C. and a solidus temperature of approximately 177° C.

If the resulting solidus temperature is lower than desired, the solder compound for contacts/cladding 104 can include less bismuth.

Figure 3:
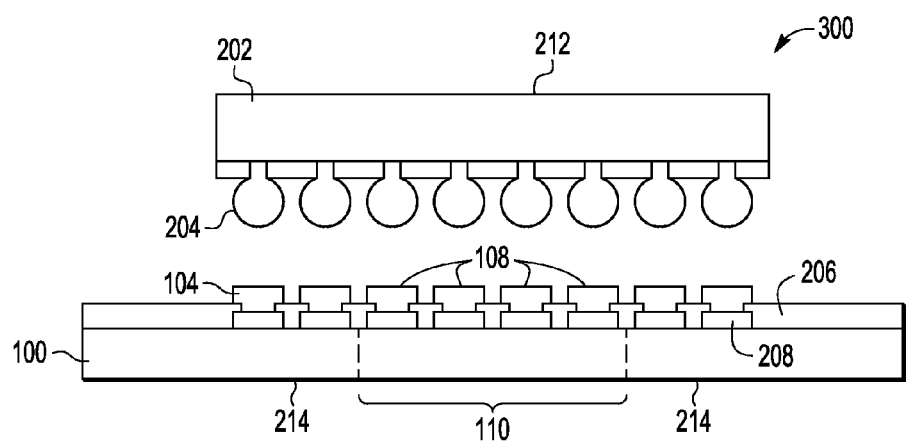
FIG. 3 shows a side view of another embodiment of a semiconductor device.

The solder compound formed during a reflow process may also be affected by controlled dissolution of metal underlying the applied solder. Referring to FIG. 3, pads 208 comprise a solder finish substance or compound that can be selectively configured to contain nickel, cobalt, zinc, or other suitable material in the inner regions of the interconnect array, and to be free of these metals in the outer region of the arrays. For example, pads 208 in region 110 can include nickel, and pads 208 outside of region 110 can be made of copper. This selective metal finishing may be applied, e.g. by plating nickel as a pad finish for the pads 208 in the inner region 110, and using copper as the pad finish for pads 208 in the outer regions 214.

The nickel and copper may be overcoated with a layer of tin, silver or other suitable material to help ensure reliable solder connections.

By now it should be appreciated that in some embodiments, a semiconductor device can comprise a package substrate; a first set of electrically conductive cladding disposed on an inner section of one external side of the substrate, the first set electrically conductive cladding fabricated with a first solder compound; and a second set of electrically conductive cladding disposed on an outer section of the one external side of the substrate, the second set of electrically conductive cladding consisting of a second solder compound. The outer section can be farther away from a center of the one external side of the substrate than the inner section. During a reflow process, the first and second solder compounds are configured to become completely molten when heated and the first solder compound solidifies at a higher temperature during cool down than the second solder compound.

In another aspect, the first solder compound can consist of at least two substances and each substance in the first solder compound is greater than or equal to 0.5 percent weight and less than or equal to 99.5 percent weight of the first solder compound.

In another aspect, the first set of electrically conductive cladding can be made of a first material with an effective solidus temperature that is greater than or equal to 20° C. higher than a second material used for the second set of electrically conductive cladding.

In another aspect, the device can further comprise an integrated circuit (IC) die with electrical contacts made of the first solder compound. The electrical contacts and the cladding can form interconnections between the IC die and the package substrate after the reflow process.

In another aspect, a solidus temperature of the second solder compound can be greater than or equal to 20° C. higher than a maximum junction temperature of the IC die.

In another aspect, the first solder compound can be made of a material that is one of a group consisting of: an alloy of 95.3 to 97.3% by weight tin, 2.0 to 3.8% by weight silver, and 0.5 to 0.9% by weight copper; an alloy of 98.5 to 99.5% by weight tin and 0.5 to 1.5% by weight copper; an alloy of 94 to 99% by weight tin and 1.0 to 6.0% by weight antimony; an alloy of 97 to 99.5% by weight tin and 0.5 to 3.0% by weight silver; and an alloy of 94.5 to 95.5% by weight tin, 2.5 to 4.5% by weight silver, and 0.5 to 1% by weight copper.

In another aspect, the second solder compound can be made of a material that is one of a group consisting of: an alloy of 40-45% by weight tin and 55 to 60% by weight bismuth; an alloy of 75 to 80% by weight tin and 20 to 25% by weight bismuth; an alloy of 39.5 to 44% by weight tin, 0.5 to 1.5% by weight silver, and 55 to 60% by weight bismuth; an alloy of 90 to 93% by weight tin and 7 to 10% by weight zinc; and an alloy of 77 to 80% by weight tin, 5 to 7% by weight bismuth, and 15 to 17% by weight zinc.

In another aspect, the solidus temperature of the first solder compound is between 201 and 221° C. and the solidus temperature of the second solder compound is between 175 and 201° C.

In another embodiment, a semiconductor device can comprise a package substrate; a first set of electrically conductive contacts disposed on an inner section of one external side of the package substrate; and a second set of electrically conductive contacts disposed on an outer section of the one external side of the package substrate. The first set of electrically conductive contacts consist of a first solder compound of substances, with each substance being greater than or equal to 1.0 percent by weight of the first solder compound, and the second set of electrically conductive contacts consist of a second solder compound of substances wherein at least one of the substances of the first solder compound is not included in the second solder compound.

In another aspect, the first set of contacts can be configured to reach a completely liquidus phase at a specified reflow temperature and to solidify at a higher temperature than the second set of contacts.

In another aspect, the first set of electrically conductive contacts can be made of a first solder compound with an effective solidus temperature that is greater than or equal to 20° C. higher than a second solder compound used for the second set of electrically conductive contacts.

In another aspect, the semiconductor device can further comprise an integrated circuit (IC) die with electrical contacts made of a first solder compound. The second set of electrical contacts on the package substrate can be made from the first solder compound and the electrical contacts of the IC die and the second set of electrical contacts on the package substrate can form interconnections between the IC die and the package substrate.

In another aspect, the first set of electrically conductive contacts can be made of a material that is one of a group consisting of: an alloy of 95.3 to 97.3% by weight tin, 2.0 to 3.8% by weight silver, and 0.5 to 0.9% by weight copper; an alloy of 98.5 to 99.5% by weight tin and 0.5 to 1.5% by weight copper; an alloy of 94 to 99% by weight tin and 1.0 to 6.0% by weight antimony; an alloy of 975.3 to 99.5% by weight tin and 0.5 to 3.0% by weight silver; and an alloy of 94.5 to 95.5% by weight tin, 2.5 to 4.5% by weight silver, and 0.5 to 1% by weight copper.

In another aspect, the second set of electrically conductive contacts can be made of a material that is one of a group consisting of: an alloy of 40-45% by weight tin and 55 to 60% by weight bismuth; an alloy of 75 to 80% by weight tin and 20 to 25% by weight bismuth; an alloy of 39.5 to 44% by weight tin, 0.5 to 1.5% by weight silver, and 55 to 60% by weight bismuth; an alloy of 90 to 93% by weight tin and 7 to 10% by weight zinc; and an alloy of 77 to 80% by weight tin, 5 to 7% by weight bismuth, and 15 to 17% by weight zinc.

In another aspect, the solidus temperature of the first solder compound can be between 201 and 221° C. and the solidus temperature of the second solder compound can be between 175 and 201° C.

In yet another embodiment, a method comprises fabricating a package substrate including electrically conductive cladding on one side of the package substrate and a first subsection of the cladding on an inner portion of the one side of the package substrate and a second subsection of the cladding on an outer portion of the package substrate. The cladding in the second subsection includes a substance that is at least 1 percent by weight and the substrates lowers the effective solidus temperature of the cladding of the second subsection by at least 15° C. compared to the effective solidus temperature of the cladding of the first subsection.

In another aspect, the first subsection of cladding can be made of a material that is one of a group consisting of: an alloy of 95.3 to 97.3% by weight tin, 2.0 to 3.8% by weight silver, and 0.5 to 0.9% by weight copper; an alloy of 98.5 to 99.5% by weight tin and 0.5 to 1.5% by weight copper; an alloy of 94 to 99% by weight tin and 1.0 to 6.0% by weight antimony; an alloy of 97 to 99.5% by weight tin and 0.5 to 3.0% by weight silver; and an alloy of 94.5 to 95.5% by weight tin, 2.5 to 4.5% by weight silver, and 0.5 to 1% by weight copper.

In another aspect, the second subsection of cladding can be made of a material that is one of a group consisting of: an alloy of 40-45% by weight tin and 55 to 60% by weight bismuth; an alloy of 75 to 80% by weight tin and 20 to 25% by weight bismuth; an alloy of 39.5 to 44% by weight tin, 0.5 to 1.5% by weight silver, and 55 to 60% by weight bismuth; an alloy of 90 to 93% by weight tin and 7 to 10% by weight zinc; and an alloy of 77 to 80% by weight tin, 5 to 7% by weight bismuth, and 15 to 17% by weight zinc.

In another aspect, the first subsection of cladding can be made of a first solder compound with an effective solidus temperature that is greater than or equal to 20° C. higher than a second solder compound used for the second subsection of cladding.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device, comprising:
 a package substrate;
 a first set of electrically conductive cladding disposed on an inner section of one external side of the substrate, the first set electrically conductive cladding fabricated with a first solder compound;
 a second set of electrically conductive cladding disposed on an outer section of the one external side of the substrate, the second set of electrically conductive cladding consisting of a second solder compound, wherein
  the outer section is farther away from a center of the one external side of the substrate than the inner section, and
  during a reflow process, the first and second solder compounds are configured to become completely molten when heated and the first solder compound solidifies at a higher temperature during cool down than the second solder compound.

2. The semiconductor device of claim 1, wherein the first solder compound consists of at least two substances and each substance in the first solder compound is greater than or equal to 0.5 percent weight and less than or equal to 99.5 percent weight of the first solder compound.

3. The semiconductor device of claim 1, wherein the first set of electrically conductive cladding is made of a first material with an effective solidus temperature that is greater than or equal to 20° C. higher than a second material used for the second set of electrically conductive cladding.

4. The semiconductor device of claim 1, further comprising an integrated circuit (IC) die with electrical contacts made of the first solder compound, wherein the electrical contacts and the cladding form interconnections between the IC die and the package substrate after the reflow process.

5. The semiconductor device of claim 4, wherein a solidus temperature of the second solder compound is greater than or equal to 20° C. higher than a maximum junction temperature of the IC die.

6. The semiconductor device of claim 1, wherein the first solder compound is made of a material that is one of a group consisting of:
   an alloy of 95.3 to 97.3% by weight tin, 2.0 to 3.8% by weight silver, and 0.5 to 0.9% by weight copper;
   an alloy of 98.5 to 99.5% by weight tin and 0.5 to 1.5% by weight copper;
   an alloy of 94 to 99% by weight tin and 1.0 to 6.0% by weight antimony;
   an alloy of 97 to 99.5% by weight tin and 0.5 to 3.0% by weight silver; and
   an alloy of 94.5 to 95.5% by weight tin, 2.5 to 4.5% by weight silver, and 0.5 to 1% by weight copper.

7. The semiconductor device of claim 1, wherein the second solder compound is made of a material that is one of a group consisting of:
   an alloy of 40-45% by weight tin and 55 to 60% by weight bismuth;
   an alloy of 75 to 80% by weight tin and 20 to 25% by weight bismuth;
   an alloy of 39.5 to 44% by weight tin, 0.5 to 1.5% by weight silver, and 55 to 60% by weight bismuth;
   an alloy of 90 to 93% by weight tin and 7 to 10% by weight zinc; and
   an alloy of 77 to 80% by weight tin, 5 to 7% by weight bismuth, and 15 to 17% by weight zinc.

8. The semiconductor device of claim 3, wherein the solidus temperature of the first solder compound is between 201 and 221° C. and the solidus temperature of the second solder compound is between 175 and 201° C.

9. A semiconductor device, comprising:
   a package substrate;
   a first set of electrically conductive contacts disposed on an inner section of one external side of the package substrate;
   a second set of electrically conductive contacts disposed on an outer section of the one external side of the package substrate,
   wherein
      the first set of electrically conductive contacts consist of a first solder compound of substances, with each substance being greater than or equal to 1.0 percent by weight of the first solder compound, and the second set of electrically conductive contacts consist of a second solder compound of substances wherein at least one of the substances of the first solder compound is not included in the second solder compound.

10. The semiconductor device of claim 9, wherein the first set of contacts are configured to reach a completely liquidus phase at a specified reflow temperature and to solidify at a higher temperature than the second set of contacts.

11. The semiconductor device of claim 9, wherein the first set of electrically conductive contacts is made of a first solder compound with an effective solidus temperature that is greater than or equal to 20° C. higher than a second solder compound used for the second set of electrically conductive contacts.

12. The semiconductor device of claim 9, further comprising an integrated circuit (IC) die with electrical contacts made of a first solder compound, wherein the second set of electrical contacts on the package substrate is made from the first solder compound and the electrical contacts of the IC die and the second set of electrical contacts on the package substrate form interconnections between the IC die and the package substrate.

13. The semiconductor device of claim 12, wherein the first solder compound has a solidus temperature greater than or equal to 20° C. higher than a maximum junction temperature of the IC die.

14. The semiconductor device of claim 9, wherein the first set of electrically conductive contacts are made of a material that is one of a group consisting of:
   an alloy of 95.3 to 97.3% by weight tin, 2.0 to 3.8% by weight silver, and 0.5 to 0.9% by weight copper;
   an alloy of 98.5 to 99.5% by weight tin and 0.5 to 1.5% by weight copper;
   an alloy of 94 to 99% by weight tin and 1.0 to 6.0% by weight antimony;
   an alloy of 975.3 to 99.5% by weight tin and 0.5 to 3.0% by weight silver; and
   an alloy of 94.5 to 95.5% by weight tin, 2.5 to 4.5% by weight silver, and 0.5 to 1% by weight copper.

15. The semiconductor device of claim 9, wherein the second set of electrically conductive contacts are made of a material that is one of a group consisting of:
   an alloy of 40-45% by weight tin and 55 to 60% by weight bismuth;
   an alloy of 75 to 80% by weight tin and 20 to 25% by weight bismuth;
   an alloy of 39.5 to 44% by weight tin, 0.5 to 1.5% by weight silver, and 55 to 60% by weight bismuth;
   an alloy of 90 to 93% by weight tin and 7 to 10% by weight zinc; and
   an alloy of 77 to 80% by weight tin, 5 to 7% by weight bismuth, and 15 to 17% by weight zinc.

16. The semiconductor device of claim 9, wherein the solidus temperature of the first solder compound is between 201 and 221° C. and the solidus temperature of the second solder compound is between 175 and 201° C.

17. a semiconductor package substrate comprising:
   electrically conductive cladding on one side of the package substrate including
      a first subsection of the cladding on an inner portion of the one side of the package substrate and a second subsection of the cladding on an outer portion of the package substrate, the cladding in the second subsection includes a substance that is at least 1 percent by weight and the substance is not included in the cladding in the first subsection and the substrates lowers the effective solidus temperature of the cladding of the second subsection by at least 15° C. compared to the effective solidus temperature of the cladding of the first subsection.

18. The package substrate of claim 17, wherein the first subsection of cladding is made of a material that is one of a group consisting of:
   an alloy of 95.3 to 97.3% by weight tin, 2.0 to 3.8% by weight silver, and 0.5 to 0.9% by weight copper;

an alloy of 98.5 to 99.5% by weight tin and 0.5 to 1.5% by weight copper;

an alloy of 94 to 99% by weight tin and 1.0 to 6.0% by weight antimony;

an alloy of 97 to 99.5% by weight tin and 0.5 to 3.0% by weight silver; and an alloy of 94.5 to 95.5% by weight tin, 2.5 to 4.5% by weight silver, and 0.5 to 1% by weight copper.

19. The package substrate of claim 17, wherein the second subsection of cladding is made of a material that is one of a group consisting of:

an alloy of 40-45% by weight tin and 55 to 60% by weight bismuth;

an alloy of 75 to 80% by weight tin and 20 to 25% by weight bismuth;

an alloy of 39.5 to 44% by weight tin, 0.5 to 1.5% by weight silver, and 55 to 60% by weight bismuth;

an alloy of 90 to 93% by weight tin and 7 to 10% by weight zinc; and an alloy of 77 to 80% by weight tin, 5 to 7% by weight bismuth, and 15 to 17% by weight zinc.

20. The package substrate of claim 17, wherein the first subsection of cladding is made of a first solder compound with an effective solidus temperature that is greater than or equal to 20° C. higher than a second solder compound used for the second subsection of cladding.

* * * * *